(12) United States Patent
Lin et al.

(10) Patent No.: US 7,663,063 B2
(45) Date of Patent: Feb. 16, 2010

(54) CIRCUIT BOARD WITH IMPROVED GROUND PLANE

(75) Inventors: Yu-Hsu Lin, Taipei Hsien (TW); Jeng-Da Wu, Taipei Hsien (TW); Chih-Hang Chao, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 5 days.

(21) Appl. No.: 11/737,147

(22) Filed: Apr. 19, 2007

(65) Prior Publication Data

US 2008/0151521 A1 Jun. 26, 2008

(30) Foreign Application Priority Data

Dec. 22, 2006 (CN) .................. 2006 1 0157882

(51) Int. Cl.
*H05K 1/03* (2006.01)
(52) U.S. Cl. .................................. 174/255; 174/260
(58) Field of Classification Search ............ 174/254, 174/255, 260
See application file for complete search history.

(56) References Cited

U.S. PATENT DOCUMENTS

| 5,348,792 | A | * | 9/1994 | Hattori et al. | 428/209 |
| 5,360,949 | A | | 11/1994 | Duxbury | |
| 5,675,299 | A | * | 10/1997 | Suski | 333/1 |
| 6,184,478 | B1 | * | 2/2001 | Imano et al. | 174/261 |
| 7,129,416 | B1 | | 10/2006 | Steinfeld et al. | |
| 2006/0144616 | A1 | | 7/2006 | Lin et al. | |

FOREIGN PATENT DOCUMENTS

| EP | 1720384 A | 11/2006 |
| JP | 6323476 A | 11/1994 |
| WO | 2007099596 A | 9/2007 |

* cited by examiner

*Primary Examiner*—Ishwarbhai B Patel
(74) *Attorney, Agent, or Firm*—Frank R. Niranjan (57) ABSTRACT

A circuit board is provided for improving signal quality, including a signal plane for a plurality of signal traces arranged thereon and a ground plane formed by a plurality of tiles connected to each other in an array. Each tile is formed by ground traces. Different line segments of a signal trace mapped on the ground plane cross ground traces of the tiles at similar angles, thereby minimizing interaction between the ground traces and the signal traces to reduce differences in impedances of the signal traces.

7 Claims, 10 Drawing Sheets

CIRCUIT BOARD WITH IMPROVED GROUND PLANE

BACKGROUND OF THE INVENTION

1. Field of the Invention

The present invention relates to a circuit board, particularly to a circuit board with an improved ground plane.

2. Description of Related Art

Circuit boards such as printed circuit boards (PCBs) are widely used in conventional electronic devices. In designing a contemporary PCB, controlling trace impedance is very important. The impedance relates to a number of parameters, such as the widths and distances of signal traces, and the thicknesses of media layers of the PCB. For example, a circuit board includes a signal plane for signal traces arranged thereon and a ground plane for ground traces arranged thereon. A media layer is disposed between the signal plane and the ground plane. Generally, the thickness of the media layer is so thin, that the impedance of the signal traces is reduced too much. That may affect the signal quality of the circuit board.

What is needed, therefore, is a circuit board having proper signal trace impedance for improving signal quality.

SUMMARY OF THE INVENTION

A circuit board is provided for improving signal quality, including a signal plane for a plurality of signal traces arranged thereon and a ground plane formed by a plurality of tiles connected to each other in an array. Each tile is formed by ground traces. Different line segments of a signal trace mapped on the ground plane cross ground traces of the tiles at similar angles, thereby minimizing interaction between the ground traces and the signal traces to reduce differences in impedances of the signal traces.

Other advantages and novel features of the present invention will become more apparent from the following detailed description of preferred embodiment when taken in conjunction with the accompanying drawings, in which:

BRIEF DESCRIPTION OF THE DRAWINGS

FIG. 4 is a cut-away view of a circuit board in accordance with a preferred embodiment, including a signal layer with a plurality of signal traces arranged thereon, a ground plane, and a media layer disposed there between;

DETAILED DESCRIPTION OF THE INVENTION

Figure 1:
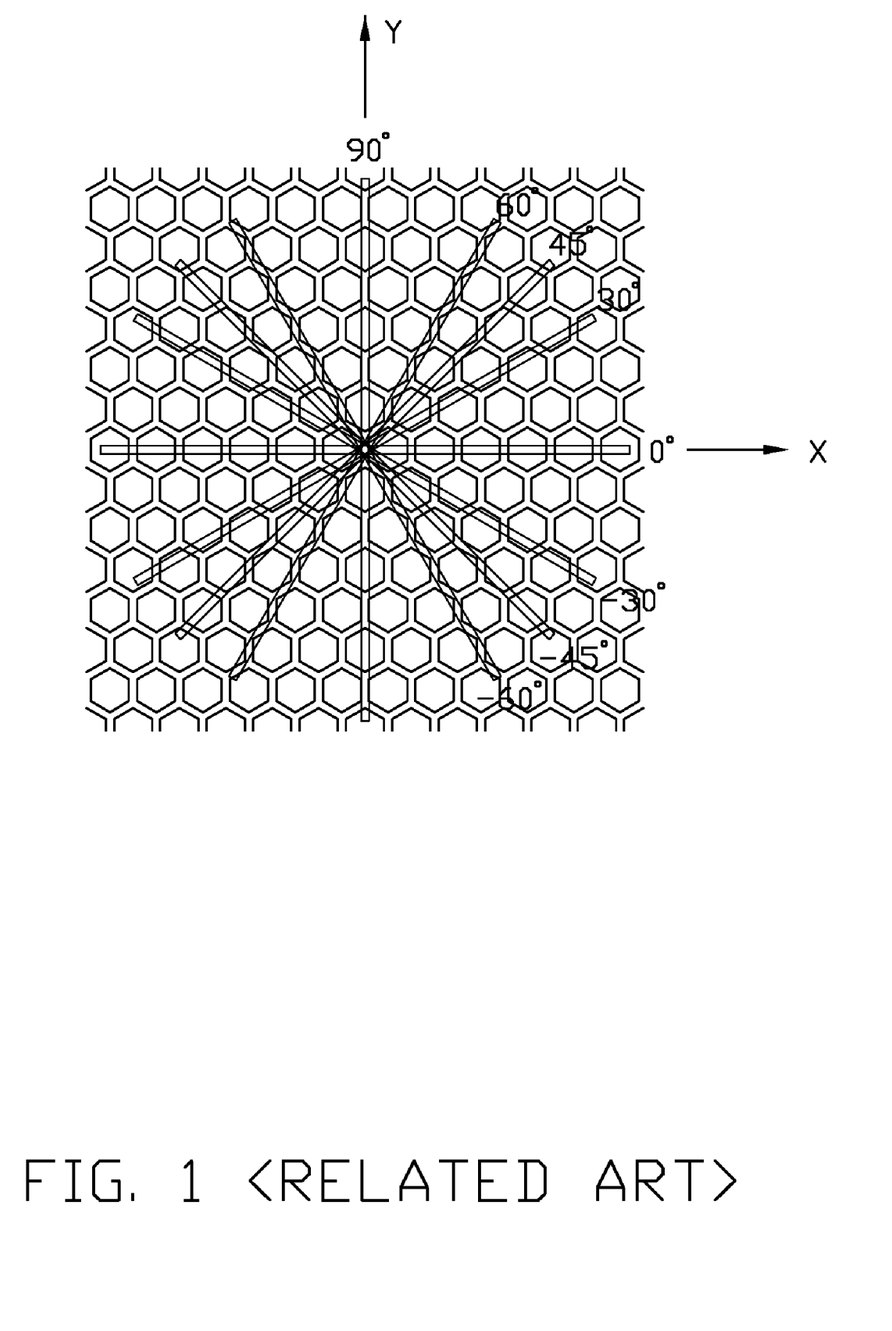
FIG. 1 is a top view of a first embodiment of a conventional ground plane of a circuit board, with straight line segments of signal traces mapped thereon.
Figure 2:
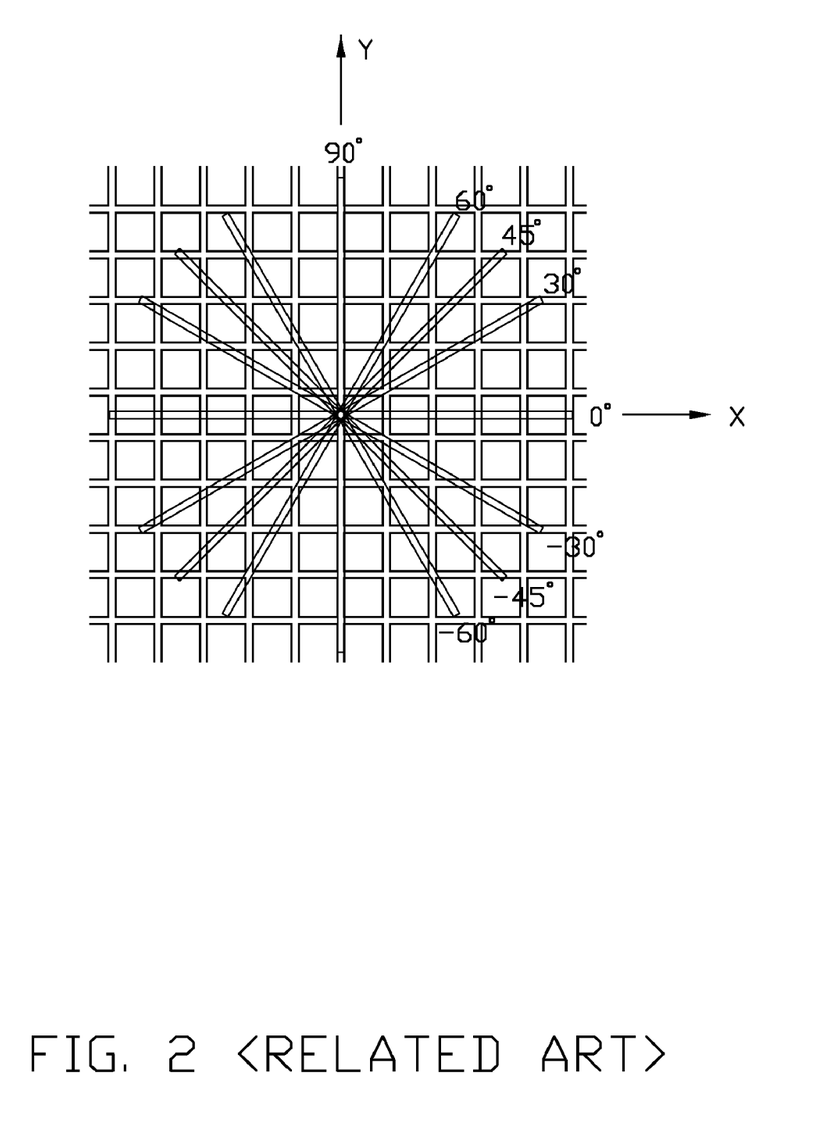
FIG. 2 is a top view of a second embodiment of a conventional ground plane of a circuit board, with straight lines segment of signal traces mapped thereon.
Figure 3:
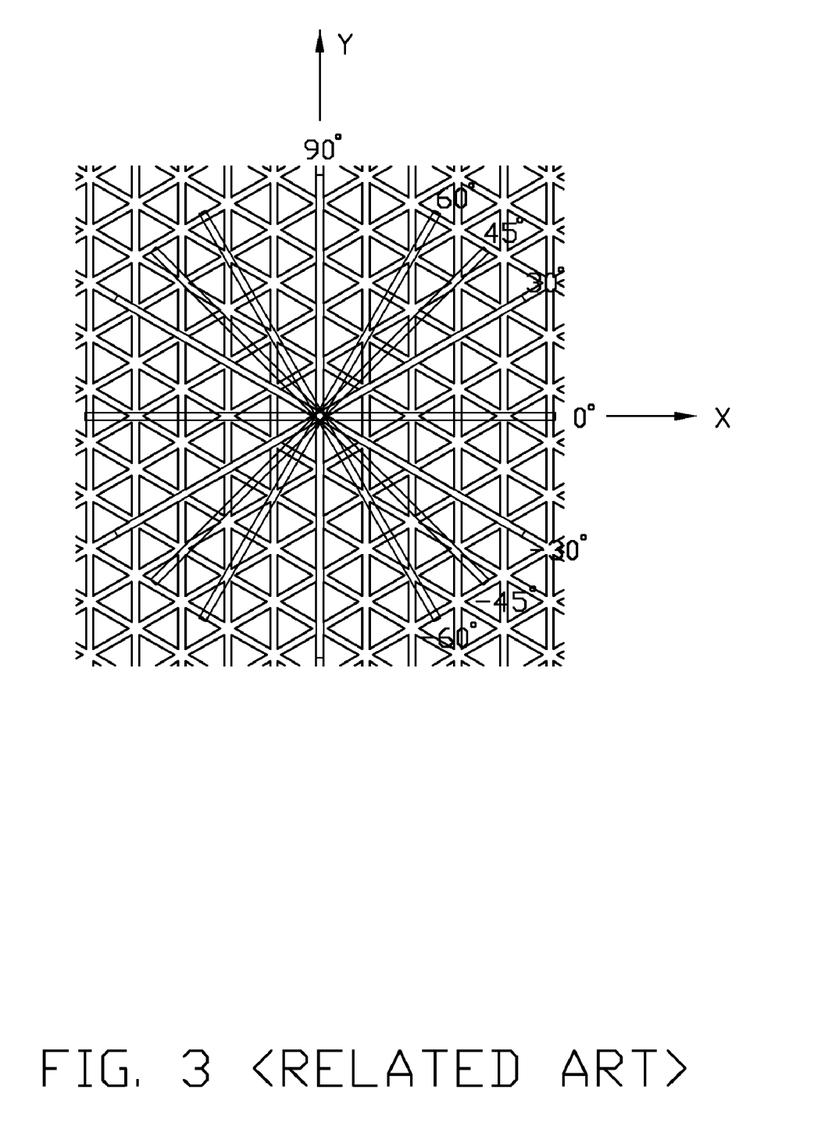
FIG. 3 is a top view of a third embodiment of a conventional ground plane of a circuit board, with straight line segments of signal traces mapped thereon.

In order to achieve a desired signal impedance of the circuit board, a ground plane formed by an array of same-sized equilateral hexagon-shaped, square, or equilateral triangle-shaped tiles (as shown in FIGS. 1-3 respectively) is typically adopted. Each tile is formed by ground traces. The ground plane defines an X-axis along which a straight line segment of a signal trace is arranged. Generally, each straight line segment of a signal trace is arranged on the signal plane at an angle of 0, 30, 45, 60, 90, −30, −45 or −60 degrees relative to an X-axis of the ground plane (as shown in FIGS. 1-3). The ground traces are also arranged at angles of 0, 30, 45, 60, 90, −30, −45 or −60 degrees relative to the X-axis of the ground plane. In designing a PCB using the preceding arrangement, some line segments of a signal trace will cross ground traces of the ground plane at an angle causing only slight variation in impedance of the signal trace. However, to the detriment of signal trace performance, some portion or portions of a signal trace line segment will be coincident with a ground trace or traces of the ground plane, causing the impedance of that portion or portions of the signal trace line segment to be greatly reduced. Thus, the impedance of the signal trace will vary unevenly to effect signal quality.

Figure 4:
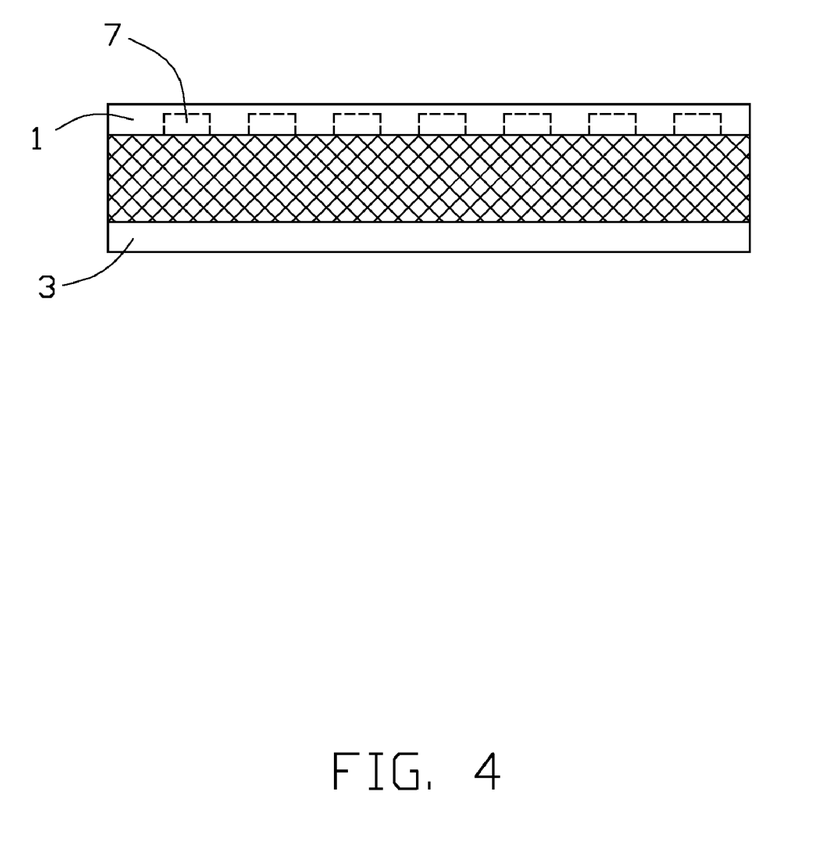

Referring to FIG. 4, which shows a circuit board with a ground plane for improving the signal quality. The circuit board in accordance with a preferred embodiment includes a signal plane 1 with a plurality of signal traces 7 arranged thereon and a ground plane 3 for a plurality of ground traces arranged thereon. Each signal trace 7 includes a plurality of straight line segments. A media layer is disposed between the signal layer 1 and the ground plane 3.

Figure 5:
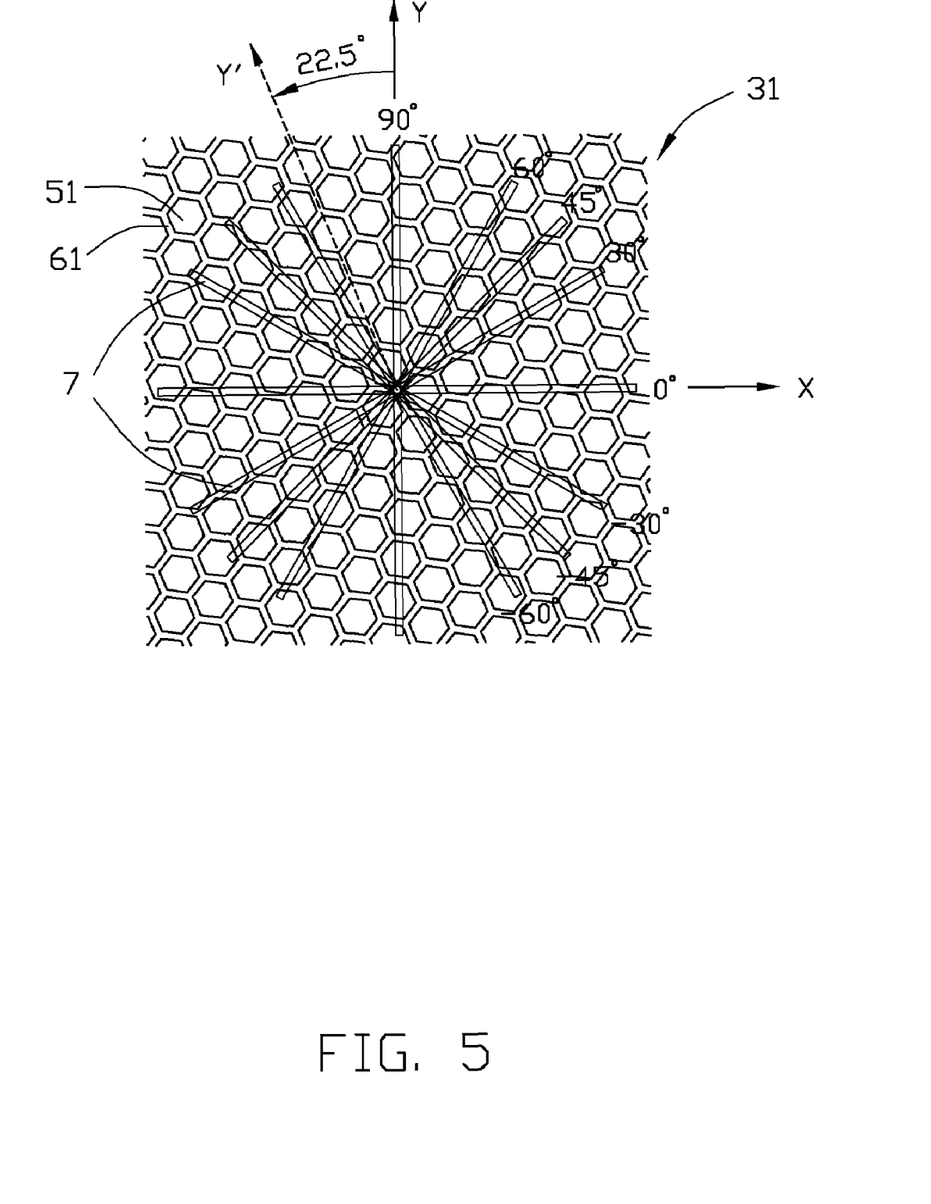
FIG. 5 is a top view of a first embodiment of a ground plane of a circuit board in accordance with a preferred embodiment, with straight line segments of signal traces mapped thereon.

Referring to FIG. 5, a ground plane 31 in accordance with a first embodiment of the present invention is shown. The ground plane 31 includes a plurality of same-sized tiles 51 connected to each other in an array. Each tile 51 is a polygon delimited by six equal straight ground traces 61 connected consecutively end-to-end, forming an equilateral hexagon-shaped tile. The ground plane 31 defines an X-axis along which a straight line segment of a signal trace 7 is arranged. A Y-axis of the ground plane 31 is perpendicular to the X-axis. A straight line passing through one straight ground trace 61 of each tile 51 is designated as a Y'-axis of the tile 51. In the present embodiment, The Y'-axis of each tile 51 is rotated 22.5 degrees relative to the Y-axis of the ground plane 31. Thus, the ground traces 61 are oriented on the ground plane 31 at angles of 22.5, 52.5, 67.5, 112.5, −7.5, −22.5, or −37.5 degrees relative to the X-axis of the ground plane 31. Each straight line segment of the signal traces 7 is arranged on the signal plane 1 at an angle of 0, 30, 45, 60, 90, −30, −45 or −60 degrees relative to the X-axis of the ground plane 31. Thus, different portions of each line segment of a signal trace 7 mapped on the ground plane 31 are at an angle of at least 7.5 degrees relative to any given ground trace they cross. With this arrangement, interaction between the ground traces and the signal traces is minimized to reduce differences in impedances of the signal traces and cause the impedance of segments of the signal traces to vary evenly, thereby greatly improving signal quality. Wherein the ground traces 61 on the ground plane 31 may be oriented at other angles relative to the ground plane 31 to ensure segments of the signal traces 7 are not coincident with the ground traces 61.

Figure 6:
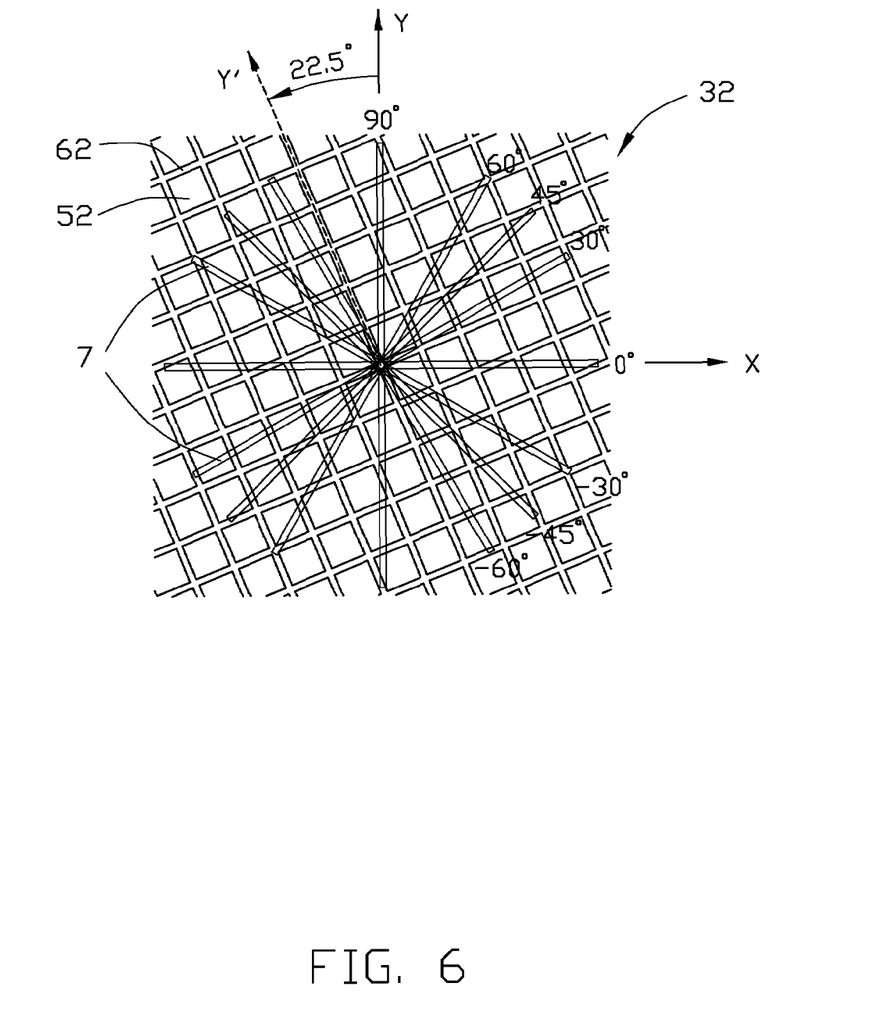
FIG. 6 is a top view of a second embodiment of a ground plane of a circuit board in accordance with a preferred embodiment, with straight line segments of signal traces mapped thereon.

Referring to FIG. 6, a ground plane 32 of a circuit board in accordance with a second embodiment is shown. The ground plane 32 of the second embodiment is similar to that of FIG. 5, but each tile of the present embodiment is a polygon delimited by four equal straight ground traces 62 connected consecutively end-to-end, forming a square tile. A Y'-axis of each tile 52 is defined by a straight line passing through one straight ground trace 52 of the square tiles. The Y'-axis of are rotated 22.5 degrees relative to the Y-axis of the ground plane 32.

Figure 7:
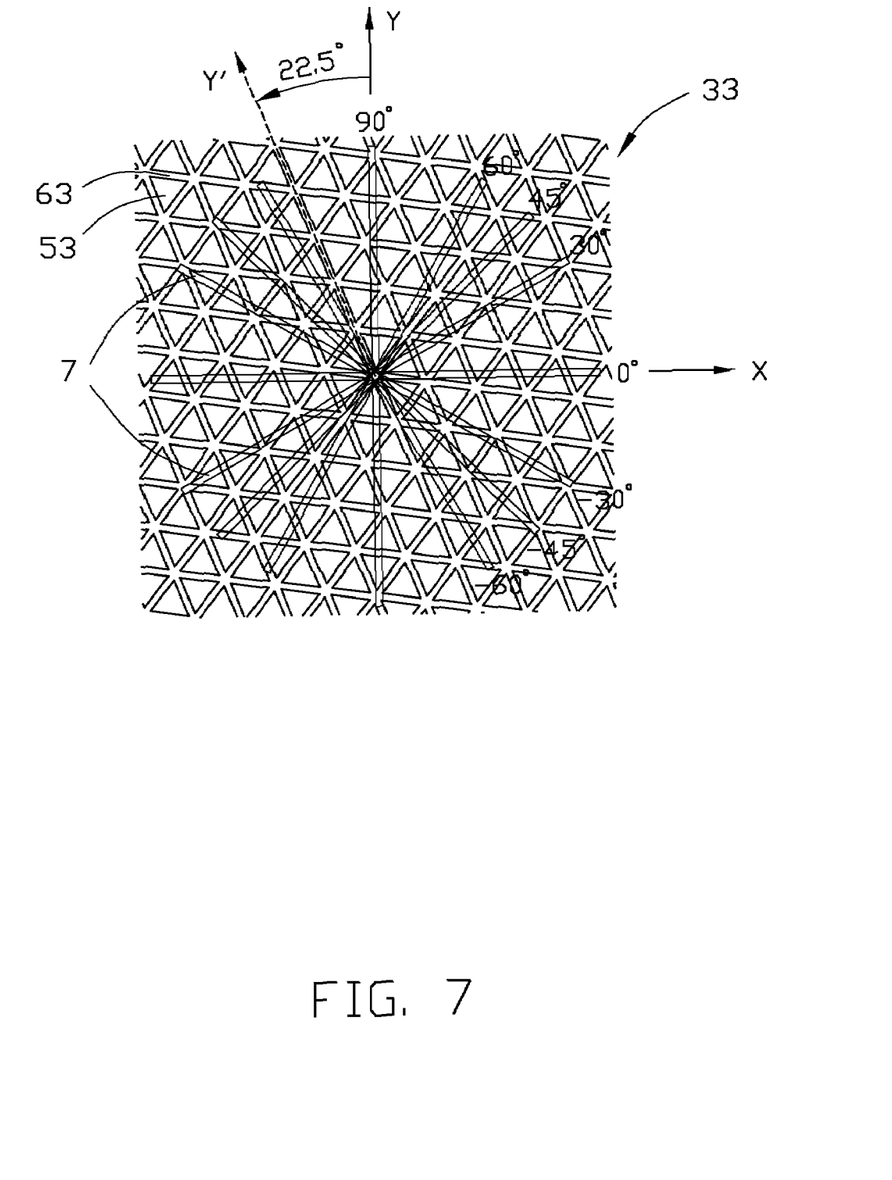
FIG. 7 is a top view of a third embodiment of a ground plane of a circuit board in accordance with a preferred embodiment, with straight line segments of signal traces mapped thereon.

Referring to FIG. 7, a ground plane 33 of a circuit board in accordance with a third embodiment is shown. The ground plane 33 of the third embodiment is similar to that of FIG. 5, but each tile 53 of the present embodiment is a polygon delimited by three equal straight ground traces 63 connected consecutively end-to-end, forming a triangle-shaped tile. A Y'-axis of each tile 53 is defined by a straight line passing through one straight ground trace of the triangle-shaped tiles. The Y'-axis are rotated 22.5 degrees relative to the Y-axis of the ground plane 33.

Wherein the tiles of the ground plane could be other polygonal shapes formed by ground traces which are oriented on the ground plane at angles to ensure segments of the signal traces are not coincident with the ground traces.

Figure 8:
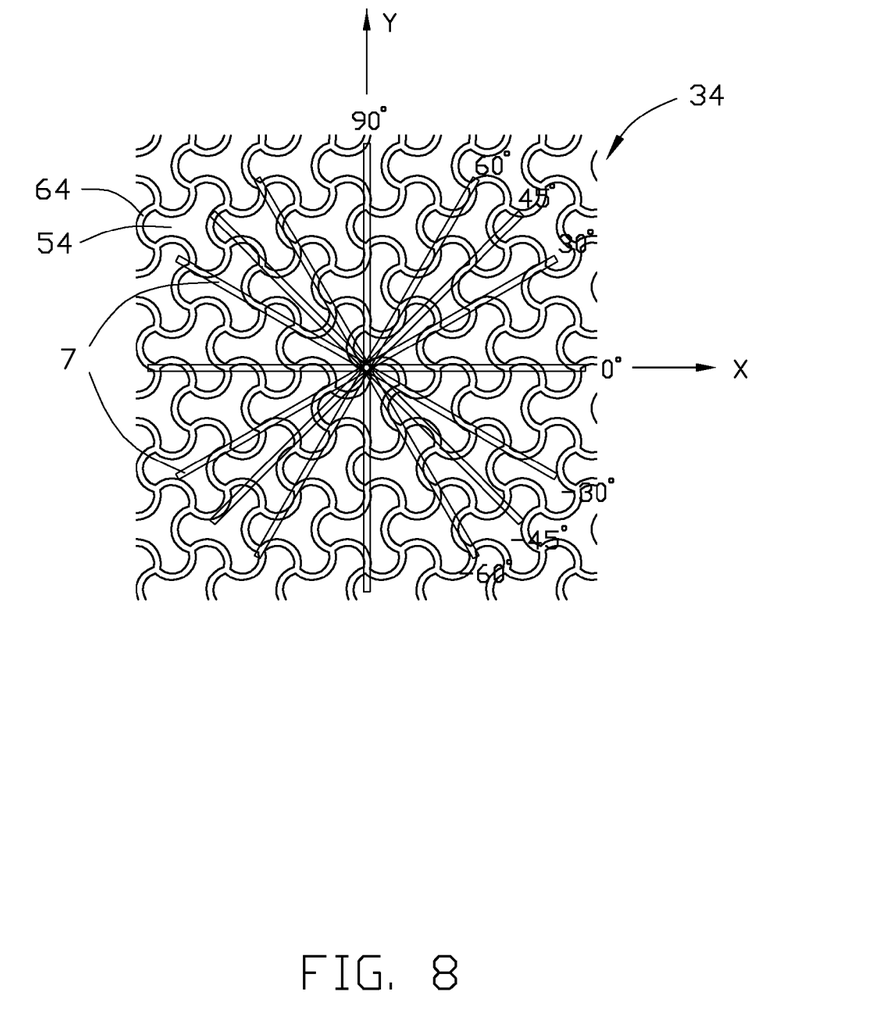
FIG. 8 is a top view of a fourth embodiment of a ground plane of a circuit board in accordance with a preferred embodiment, with straight line segments of signal traces mapped thereon.

Referring to FIG. 8, which shows a ground plane 34 of a circuit board in accordance with a fourth embodiment. In this embodiment, the ground plane 34 includes a plurality of same-sized and generally triangle-shaped tiles 54 with rounded convex corners and rounded concave sides. Each tile 54 is formed by curved ground traces 64.

Figure 9:
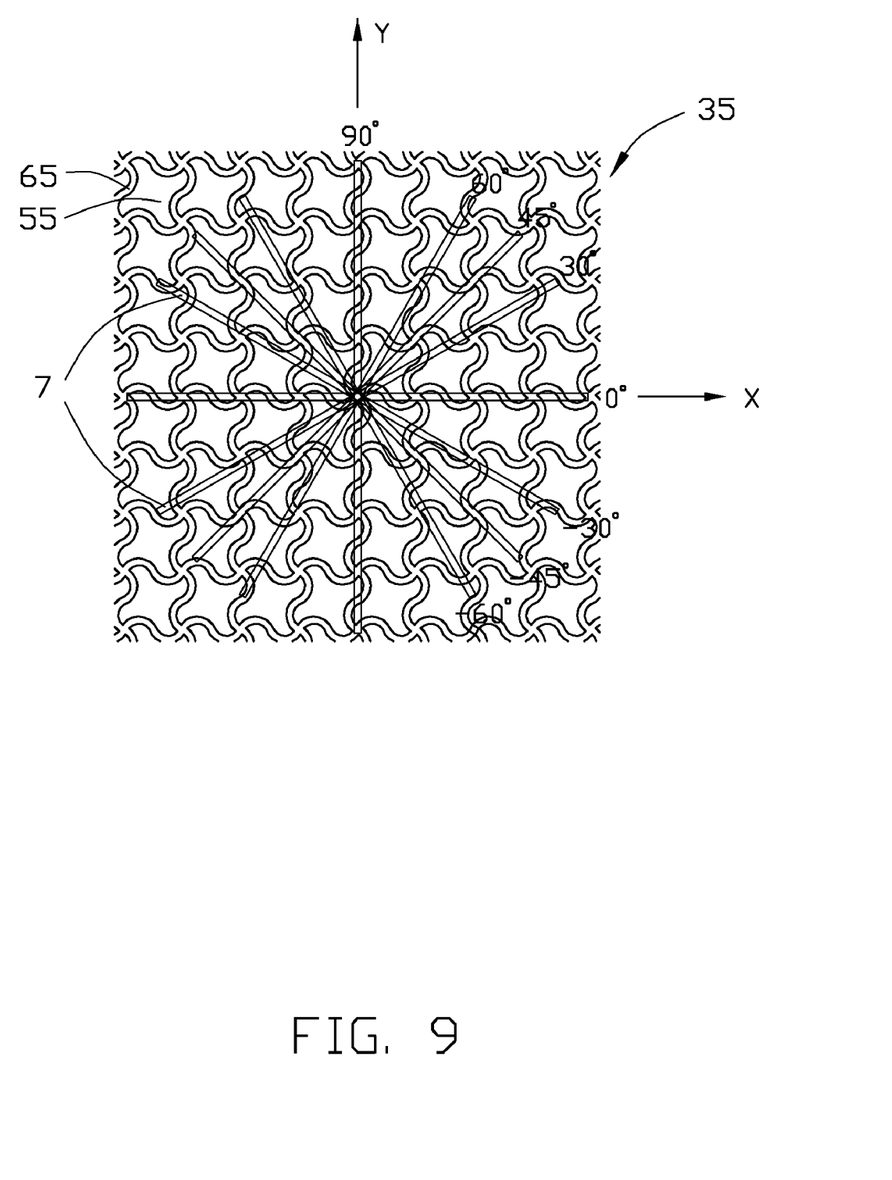
FIG. 9 is a top view of a fifth embodiment of a ground plane of a circuit board in accordance with a preferred embodiment, with straight line segments of signal traces mapped thereon.

Referring to FIG. 9, which shows a ground plane 35 of a circuit board in accordance with a fifth embodiment. In this embodiment, the ground plane 35 includes a plurality of same-sized and generally square-shaped tiles 55 with wavy sides. Each tile 55 is formed by curved ground traces 65.

Figure 10:
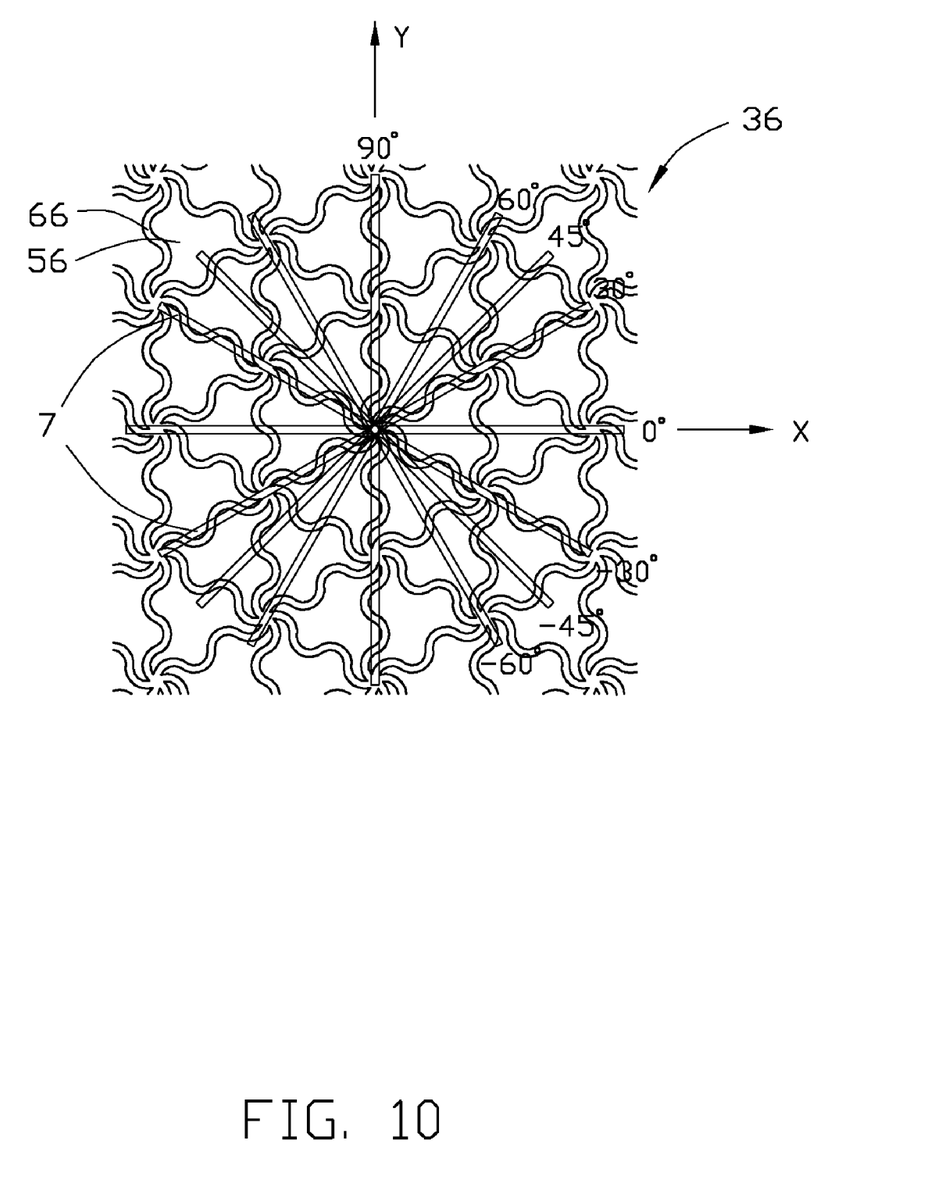
FIG. 10 is a top view of a sixth embodiment of a ground plane of a circuit board in accordance with a preferred embodiment, with straight line segments of signal traces mapped thereon.

Referring to FIG. 10, which shows a ground plane 36 of a circuit board in accordance with a sixth embodiment. In this embodiment, the ground plane 36 includes a plurality of same-sized and generally triangle-shaped tiles 56 with wavy sides. Each tile 56 is formed by curve ground traces 66.

According to the above, different portions of each line segment of a signal trace mapped on the ground plane will cross any given ground trace at a similar angle since the tiles are formed by curved ground traces. With this arrangement, interaction between the ground traces and the signal traces is minimized to reduce differences in impedances of the signal traces and cause the impedance of segments of the signal traces to vary evenly, thereby greatly improving signal quality. Wherein the tiles of the ground plane may be formed as other shapes by curved ground traces.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A circuit board, comprising:
   a signal plane for a plurality of signal traces arranged thereon, each of the signal traces comprising a plurality of straight line segments, each line segment extending along a path different from the others; and
   a ground plane comprising a plurality of equilateral polygon shaped tiles having the same shape and connected to each other in an array, each tile formed by ground traces, all of the line segments of each signal trace mapped on the ground plane arranged at about 22.5 degrees relative to any given ground trace of the tiles, thereby minimizing interaction between the ground traces and the signal traces to reduce differences in impedances of the signal traces.

2. The circuit board as described in claim 1, wherein each tile is formed by a plurality of curved ground traces connected consecutively end-to-end.

3. The circuit board as described in claim 2, wherein each tile is generally triangle-shaped and has convex corners and concave sides.

4. The circuit board as described in claim 2, wherein each tile is generally square-shaped and has wavy sides.

5. The circuit board as described in claim 2, wherein each tile is generally triangle-shaped and has wavy sides.

6. The circuit board as described in claim 1, wherein the line segments each signal trace are arranged at about 0 degree, 30 degrees, 45 degrees, 60 degrees or 90 degrees relative to one of the two adjacent sides of the circuit board.

7. The circuit board as described in claim 6, wherein each tile is equilateral triangle shaped, square shaped or equilateral hexagon shaped.

\* \* \* \* \*